(12) United States Patent  
Furusho et al.

(10) Patent No.: US 11,990,833 B2  
(45) Date of Patent: May 21, 2024

(54) NOISE FILTER

(71) Applicant: Mitsubishi Electric Corporation, Tokyo (JP)

(72) Inventors: Yasuaki Furusho, Tokyo (JP); Ryota Asakura, Tokyo (JP); Ryosuke Kobayashi, Tokyo (JP); Mamoru Kamikura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 77 days.

(21) Appl. No.: 17/917,628

(22) PCT Filed: Jul. 13, 2020

(86) PCT No.: PCT/JP2020/027197  
§ 371 (c)(1),  
(2) Date: Oct. 7, 2022

(87) PCT Pub. No.: WO2022/013905  
PCT Pub. Date: Jan. 20, 2022

(65) Prior Publication Data  
US 2023/0179085 A1  Jun. 8, 2023

(51) Int. Cl.  
*H02M 1/12* (2006.01)

(52) U.S. Cl.  
CPC .................. *H02M 1/126* (2013.01)

(58) Field of Classification Search  
CPC .......... H02M 1/12; H02M 1/126; H02M 1/14; H02M 1/143  
See application file for complete search history.

(56) References Cited

U.S. PATENT DOCUMENTS

| 3,259,693 A | 7/1966 | Watanabe |
| 4,491,976 A | 1/1985 | Saitoh et al. |

(Continued)

FOREIGN PATENT DOCUMENTS

| CN | 109217648 A | 1/2019 |
| DE | 1 275 637 B | 8/1968 |

(Continued)

OTHER PUBLICATIONS

International Search Report and Written Opinion dated Sep. 15, 2020, received for PCT Application PCT/JP2020/027197, filed on Jul. 13, 2020, 8 pages including English Translation.

(Continued)

*Primary Examiner* — Adolf D Berhane  
(74) *Attorney, Agent, or Firm* — XSENSUS LLP

(57) ABSTRACT

Provided is a low-cost noise filter having a noise suppression effect that is not reduced even when a resonance frequency changes according to changes in temperature. A noise filter includes: a noise detection unit which detects a common mode noise; a cancellation signal output unit; an injection unit which injects a cancellation signal; and a grounded capacitor. The cancellation signal output unit includes a filter part which generates the cancellation signal from the common mode noise, and an amplification part which amplifies the cancellation signal. A temperature dependence of a product of an inductance value and a capacitance value of a main circuit portion including the noise detection unit, the injection unit, and the grounded capacitor, and a temperature dependence of a product of an inductance value and a capacitance value of the filter part, are equal to each other.

10 Claims, 9 Drawing Sheets

(56) References Cited

U.S. PATENT DOCUMENTS

| | | | |
|---|---|---|---|
| 11,616,433 B2 * | 3/2023 | Kumar | H02M 3/33561 |
| | | | 363/39 |
| 2002/0050872 A1 | 5/2002 | Terashima et al. | |
| 2004/0248742 A1 | 12/2004 | Terashima et al. | |
| 2009/0133839 A1 | 5/2009 | Yamazawa et al. | |
| 2013/0010506 A1 | 1/2013 | Sakai et al. | |
| 2020/0321857 A1 * | 10/2020 | Osako | H02P 27/06 |
| 2023/0109575 A1 * | 4/2023 | Poon | H02M 1/44 |
| | | | 363/21.01 |

FOREIGN PATENT DOCUMENTS

| | | |
|---|---|---|
| JP | 9-215341 A | 8/1997 |
| JP | 2002-141704 A | 5/2002 |
| JP | 2010-57268 A | 3/2010 |

OTHER PUBLICATIONS

Anne Roc'h et al., "In Situ Performances of Common Mode Chokes", EMC Europe 2011, York, UK, IEEE, Sep. 26, 2011, p. 494-499.

Extended European Search Report dated Jul. 5, 2023 in European Patent Application No. 20945364.6, 9 pages.

* cited by examiner

NOISE FILTER

CROSS-REFERENCE TO RELATED APPLICATION

The present application is based on PCT filing PCT/JP2020/027197, filed Jul. 13, 2020, the entire contents of which are incorporated herein by reference.

TECHNICAL FIELD

The present disclosure relates to a noise filter.

BACKGROUND ART

A power conversion device for converting input power from a power supply into arbitrarily-determined DC power or AC power and supplying the converted power to a load, has been known. The power conversion device generates high-frequency noise caused by a switching operation. The high-frequency noise causes a common mode noise passing through a ground potential via a parasitic capacitance or the like and flowing to the power supply or the load. In order to suppress the common mode noise, a noise filter is disposed on an electrical path between the power supply and the power conversion device or an electrical path between the power conversion device and the load.

One type of noise filter is an active noise filter. The active noise filter includes: a noise detection unit which detects a common mode noise on the electrical path; a cancellation signal output unit which generates a cancellation signal from the detected common mode noise and outputs the cancellation signal; and an injection unit which injects the cancellation signal into the electrical path. If a choke coil is used as each of the noise detection unit and the injection unit, a resonance based on an inductance component of the choke coil and a capacitive component on the electrical path is generated. Considering this, the cancellation signal output unit includes a filter part which adjusts an amplification factor in the frequency of the resonance.

The magnetic permeability of a core material of the choke coil changes according to the temperature of the choke coil. Thus, if the temperature of the choke coil changes, the resonance frequency changes. If the resonance frequency changes according to changes in temperature, a difference is generated between the resonance frequency and a frequency characteristic of the filter part, whereby a noise suppression effect is reduced. A conventional noise filter includes a temperature detector which detects a temperature of a choke coil, and a controller which causes a frequency characteristic of a filter to match a resonance frequency according to the temperature detected by the temperature detector (see, for example, Patent Document 1).

CITATION LIST

Patent Document

Patent Document 1: Japanese Laid-Open Patent Publication No. 9-215341

SUMMARY OF THE INVENTION

Problems to be Solved by the Invention

However, since the conventional noise filter includes the temperature detector which detects a temperature of the choke coil and the controller which causes the frequency characteristic of the filter part to match the resonance frequency according to the temperature detected by the temperature detector, a problem arises in that the noise filter requires high cost.

The present disclosure has been made to solve the above problem, and an object of the present disclosure is to provide a low-cost noise filter having a noise suppression effect that is not reduced even when a resonance frequency changes according to changes in temperature.

Solution to the Problems

A noise filter in the present disclosure includes: a noise detection unit which detects a common mode noise on an electrical path; a cancellation signal output unit which generates a cancellation signal from the detected common mode noise and outputs the cancellation signal; an injection unit which injects the cancellation signal into the electrical path; and a grounded capacitor connected to the electrical path. The cancellation signal output unit includes a filter part which generates the cancellation signal by filtering the detected common mode noise, and an amplification part which amplifies the cancellation signal. A temperature dependence of a product of an inductance value and a capacitance value of a main circuit portion including the noise detection unit, the injection unit, and the grounded capacitor, and a temperature dependence of a product of an inductance value and a capacitance value of the filter part, are equal to each other.

Effect of the Invention

In the noise filter in the present disclosure, the temperature dependence of the product of the inductance value and the capacitance value of the main circuit portion, and the temperature dependence of the product of the inductance value and the capacitance value of the filter part, are set to be equal to each other. Consequently, the noise suppression effect is not reduced even when a resonance frequency changes according to changes in temperature. In addition, this noise filter eliminates the need for a temperature detector which detects a temperature of the noise detection unit or the like and a controller which causes a frequency characteristic of the filter part to match the resonance frequency according to the temperature. Thus, this noise filter requires low cost.

DESCRIPTION OF EMBODIMENTS

Figure 1:
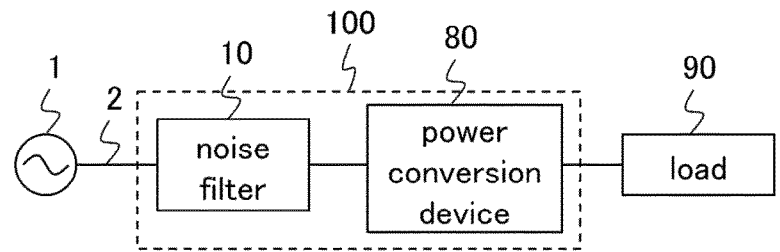
FIG. 1 is a configuration diagram of a power conversion system according to embodiment 1.

Hereinafter, noise filters according to embodiments for carrying out the present disclosure will be described in detail with reference to the drawings. The same or corresponding components in the drawings are denoted by the same reference characters.

Embodiment 1

FIG. 1 is a configuration diagram of a power conversion system to which a noise filter according to embodiment 1 has been applied. A power conversion system 100 is disposed between an AC power supply 1 and a load 90. The power conversion system 100 is composed of: a power conversion device 80 which converts power inputted from the AC power supply 1 through a power supply wire 2; and a noise filter 10 interposed between the AC power supply 1 and the power conversion device 80. The power conversion device 80 converts the power inputted from the AC power supply 1 into power necessary for driving the load 90 and outputs the converted power. Although the noise filter 10 is disposed between the AC power supply 1 and the power conversion device 80 in the present embodiment, the noise filter 10 may be disposed between the power conversion device 80 and the load 90.

Figure 2:
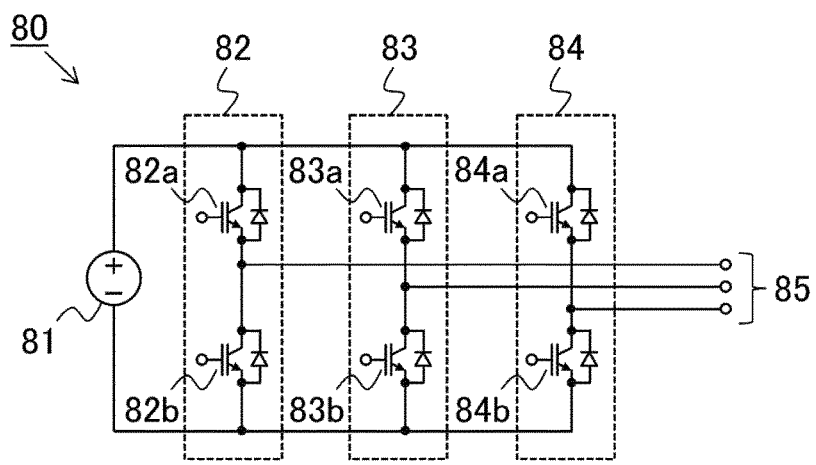
FIG. 2 is a configuration diagram of a power conversion device according to embodiment 1.

FIG. 2 is a configuration diagram showing an example of the power conversion device 80 in the present embodiment. This power conversion device 80 is a two-level three-phase inverter. Two semiconductor switches 82a and 82b connected in series compose one upper-lower arm 82. In addition, two semiconductor switches 83a and 83b connected in series compose one upper-lower arm 83. Further, two semiconductor switches 84a and 84b connected in series compose one upper-lower arm 84. A DC power supply 81 is connected to the three upper-lower arms 82, 83, and 84. Midpoints of the three upper-lower arms 82, 83, and 84 are connected to inverter output terminals 85. These six semiconductor switches 82a, 82b, 83a, 83b, 84a, and 84b perform switching operations so that AC power is outputted to each inverter output terminal 85. At this time, the output potential of the inverter output terminal 85 is a potential of either one of a positive voltage and a negative voltage of the DC power supply 81. Therefore, a common mode voltage of this power conversion device 80 is a fixed voltage that is not zero.

Figure 3:
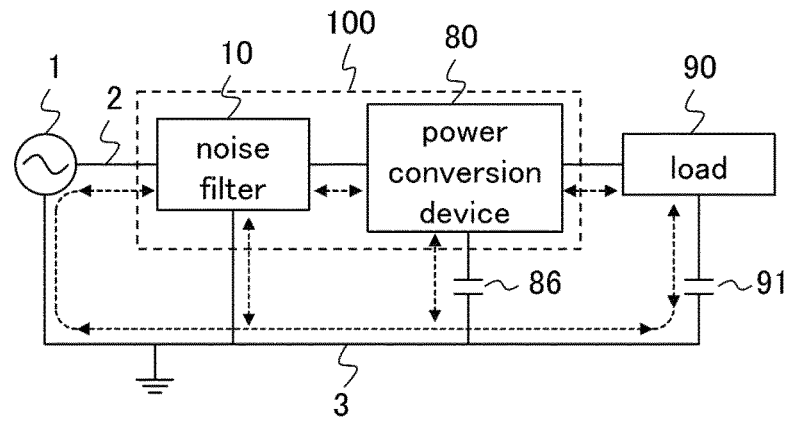
FIG. 3 is a diagram for explaining a common mode noise in the power conversion system according to embodiment 1.

FIG. 3 is a diagram for explaining a common mode noise in the power conversion system in the present embodiment. In this power conversion system 100, a parasitic capacitance 86 is present between a ground wire 3 and the power conversion device 80, and a parasitic capacitance 91 is present between the ground wire 3 and the load 90. As indicated by dash-line arrows in FIG. 3, in the power conversion system 100, the common mode voltage of the power conversion device 80 is applied to a common mode loop extending through the parasitic capacitances 86 and 91 and the ground wire 3, whereby a common mode current (common mode noise) flows.

Figure 4:
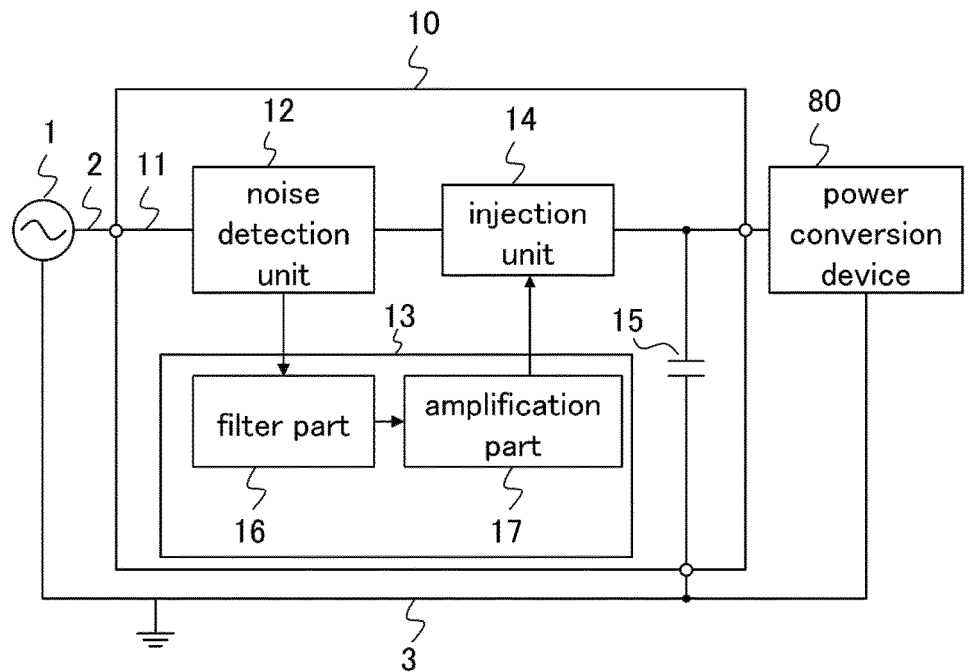
FIG. 4 is a configuration diagram of a noise filter according to embodiment 1.

FIG. 4 is a configuration diagram of the noise filter 10 in the present embodiment. This noise filter 10 is interposed between the AC power supply 1 and the power conversion device 80. The noise filter 10 includes: a noise detection unit 12 disposed on an electrical path 11 leading to the power supply wire 2; a cancellation signal output unit 13 which generates a cancellation signal from a common mode noise detected by the noise detection unit 12 and outputs the cancellation signal; an injection unit 14 disposed, on the electrical path 11, on the output side relative to the noise detection unit 12; and a grounded capacitor 15 disposed between the electrical path 11 and the ground potential. The cancellation signal output unit 13 includes: a filter part 16 which generates a cancellation signal by filtering the common mode noise detected by the noise detection unit 12; and an amplification part 17 which amplifies the cancellation signal.

Figure 5:
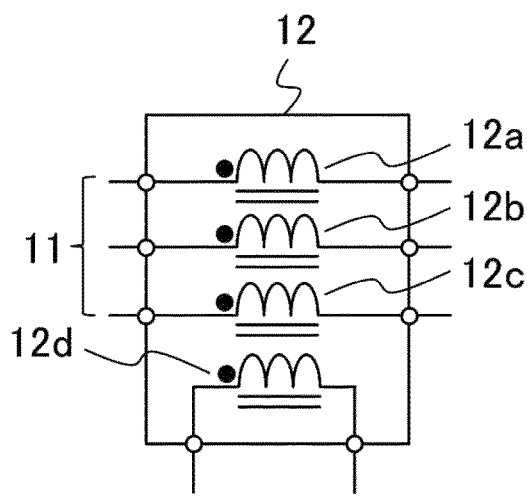
FIG. 5 is a configuration diagram of a noise detection unit according to embodiment 1.

FIG. 5 is a configuration diagram of the noise detection unit 12 in the present embodiment. This noise detection unit 12 is formed as a common mode transformer. The common mode transformer forming the noise detection unit 12 is referred to as a detection transformer herein. This detection transformer is, on the electrical path 11 leading to the power supply wire 2 for the AC power supply 1, composed of: an R-phase winding 12a wound on an R-phase power line; an S-phase winding 12b wound on an S-phase power line; a T-phase winding 12c wound on a T-phase power line; and an auxiliary winding 12d. The R-phase winding 12a, the S-phase winding 12b, and the T-phase winding 12c are wound in the same phase. In the noise detection unit 12 having been thus configured, magnetic fluxes generated in a normal mode cancel each other out, and magnetic fluxes generated in a common mode intensify each other. Therefore, the detection transformer takes a high inductance value only with respect to the common mode and serves as a common mode choke coil. In this noise detection unit 12, a common mode noise detection signal is generated at each of both ends of the auxiliary winding 12d owing to a common mode noise passing through the detection transformer. Both ends of the auxiliary winding 12d are connected to the filter part 16.

Figure 6:
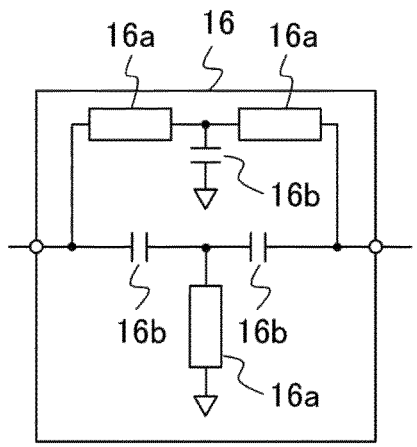
FIG. 6 is a configuration diagram of a filter part according to embodiment 1.

FIG. 6 is a configuration diagram showing an example of the filter part 16 according to the present embodiment. This filter part 16 is formed by connecting two circuits in parallel. One of the circuits is composed of: two resistors 16a connected in series; and a capacitor 16b connected between the ground potential and a midpoint between the two resistors 16a. The other circuit is composed of: two capacitors 16b connected in series; and a resistor 16a connected between the ground potential and a midpoint between the two capacitors 16b. This filter part 16 is a notch filter called a twin-T filter and attenuates a gain by means of a specific frequency called a rejection frequency. The filter part 16 generates a cancellation signal by performing notch filtering on the common mode noise detection signal inputted from the noise detection unit 12 and outputs this cancellation signal to the amplification part 17.

Figure 7:
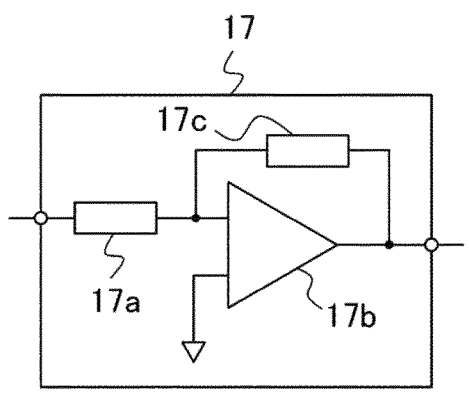
FIG. 7 is a configuration diagram of an amplification part according to embodiment 1.

FIG. 7 is a configuration diagram of the amplification part 17 in the present embodiment. This amplification part 17 is composed of an input resistor 17a, an operational amplifier 17b, and a feedback resistor 17c. This amplification part 17 is an inverting amplification circuit or a non-inverting amplification circuit in which the operational amplifier 17b is used. The amplification part 17 amplifies, with an amplification factor expressed as a ratio between a resistance value of the input resistor 17a and a resistance value of the feedback resistor 17c, the cancellation signal inputted from the filter part 16 and outputs the amplified cancellation signal to the injection unit 14.

Figure 8:
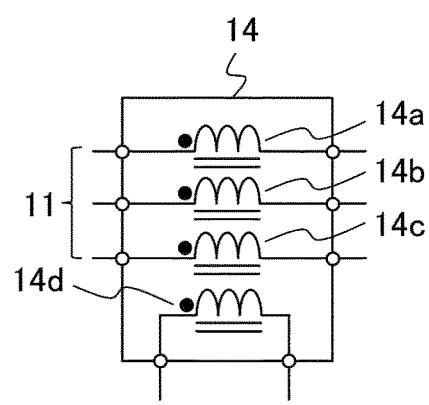
FIG. 8 is a configuration diagram of an injection unit according to embodiment 1.

FIG. 8 is a configuration diagram of the injection unit 14 in the present embodiment. This injection unit 14 is formed as a common mode transformer. The common mode transformer forming the injection unit 14 is referred to as an injection transformer herein. This injection transformer is, on the electrical path 11, composed of: an R-phase winding 14a wound on an R-phase power line; an S-phase winding 14b wound on an S-phase power line; a T-phase winding 14c wound on a T-phase power line; and an auxiliary winding 14d. The R-phase winding 14a, the S-phase winding 14b, and the T-phase winding 14c are wound in the same phase. Therefore, the injection transformer takes a high inductance value only with respect to the common mode and serves as a common mode choke coil. In the injection unit 14 having been thus configured, the cancellation signal is inputted to each of both ends of the auxiliary winding 14d. Then, in this injection unit 14, a voltage for canceling the common mode noise is induced with respect to each of the R-phase winding 14a, the S-phase winding 14b, and the T-phase winding 14c according to the cancellation signal inputted to the auxiliary winding 14d.

Figure 9:
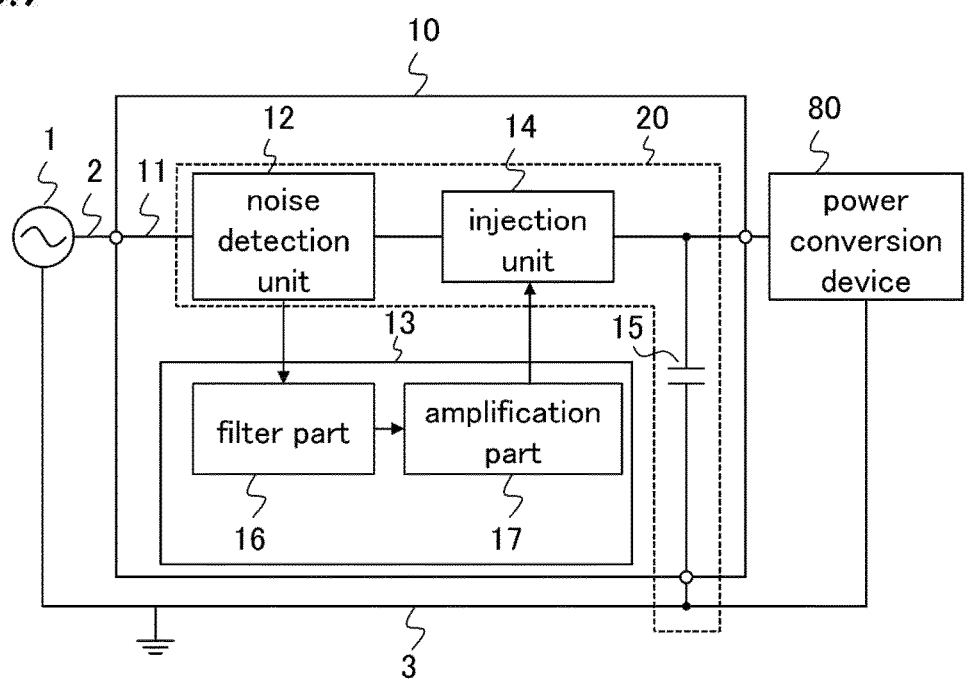
FIG. 9 is a diagram for explaining a main circuit portion of the noise filter according to embodiment 1.

FIG. 9 is a diagram for explaining a main circuit portion in the noise filter according to the present embodiment. Here, a portion composed of the noise detection unit 12, the injection unit 14, and the grounded capacitor 15 is referred to as a main circuit portion 20. An inductance value of the main circuit portion 20 is the sum of an inductance value of the common mode choke coil forming the noise detection unit 12 and an inductance value of the common mode choke coil forming the injection unit 14. A capacitance value of the main circuit portion 20 is a capacitance value of the grounded capacitor 15. An inductance value and a capacitance value of the filter part 16 are respectively the sum of inductance values of respective elements composing the filter part 16 and the sum of capacitance values of respective elements composing the filter part 16.

Figure 10A:
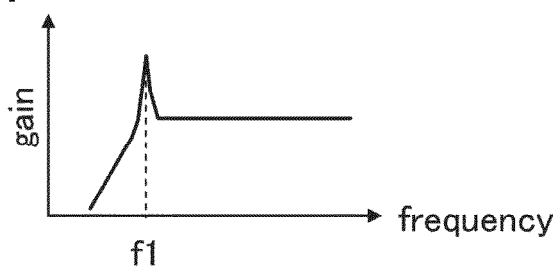
FIG. 10A, FIG. 10B and FIG. 10C are schematic diagrams showing control responses of the main circuit portion in embodiment 1.
Figure 10B:
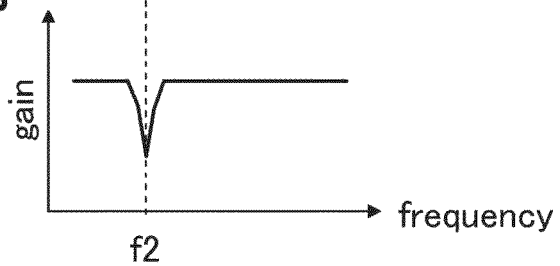
Figure 10C:
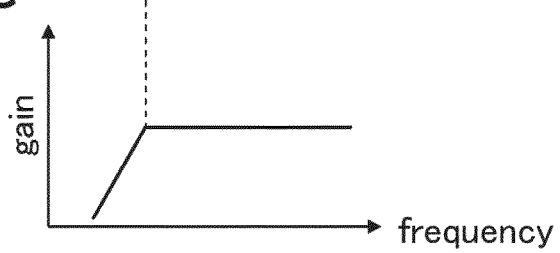

FIG. 10A, FIG. 10B and FIG. 10C are schematic diagrams showing control responses of the main circuit portion 20. In FIG. 10A, FIG. 10B and FIG. 10C, the horizontal axis indicates frequency, and the vertical axis indicates gain. Here, the control response refers to an open-loop response in a path extending from the output side of the noise detection unit 12 through the cancellation signal output unit 13 and the injection unit 14 and returning to the noise detection unit 12 again. The control stability of the noise filter 10 is managed on the basis of the values of a gain margin and a phase margin of this open-loop response.

FIG. 10A is a schematic diagram showing an open-loop response obtained in the case where the filter part 16 is not present. Here, if the inductance value of the main circuit portion 20 is defined as L1 and the capacitance value of the main circuit portion 20 is defined as C1, a resonance frequency f1 of the main circuit portion 20 is expressed as $f1=1/\{2\pi\sqrt{(L1 \times C1)}\}$. As shown in FIG. 10A, a high resonance peak is generated at f1 so as to cause phase rotation in the open-loop response obtained in the case where the filter part 16 is not present. Therefore, the control response of the main circuit portion 20 is destabilized. It is noted that the inductance value L1 of the main circuit portion 20 is the sum of the inductance value of the common mode choke coil forming the noise detection unit 12 and the inductance value of the common mode choke coil forming the injection unit 14. The capacitance value C1 of the main circuit portion 20 is the capacitance value of the grounded capacitor 15.

FIG. 10B is a schematic diagram showing a filter passage characteristic of the filter part 16. As shown in FIG. 6, this filter part 16 is a notch filter. A rejection frequency f2 is matched with the resonance frequency f1 of the main circuit portion 20. Here, if the inductance value of the filter part 16 is defined as L2 and the capacitance value of the filter part 16 is defined as C2, the rejection frequency f2 of the filter part 16 is expressed as $f2=1/\{2\pi\sqrt{(L2 \times C2)}\}$. Further, this rejection frequency f2 is set to be equal to the resonance frequency f1 of the main circuit portion 20 (f1=f2).

FIG. 10C is a schematic diagram showing an open-loop response obtained in the case where the filter part 16 is present. As shown in FIG. 10C, the high resonance peak at f1 is attenuated by the filter passage characteristic of the filter part 16 in the open-loop response obtained in the case where the filter part 16 is present.

Thus, the cancellation signal output unit 13 including the filter part 16 can generate a cancellation signal obtained by attenuating the unnecessary resonance peak, of the main circuit portion 20, included in the noise detected by the noise detection unit 12. As a result, the noise filter 10 can exhibit a stable noise suppression effect.

Next, a change, in the noise suppression effect, that occurs when a temperature is changed in the noise filter 10 having been thus configured will be described.

Figure 11:
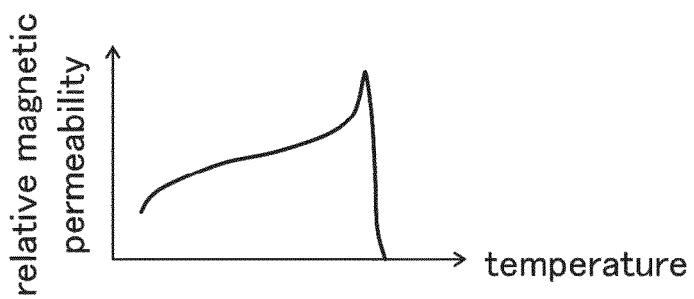
FIG. 11 is a characteristic graph of a core material in embodiment 1.

FIG. 11 is a characteristic graph showing a temperature dependence of the relative magnetic permeability of a general core material that is used for each of the common mode choke coils and that is exemplified by Mn—Zn ferrite. The magnetic permeability of this ferrite increases in association with rise in the temperature of the ferrite from a very low temperature to a temperature immediately before arrival at the Curie temperature thereof. Since the inductance value of the common mode choke coil is proportionate to the relative magnetic permeability thereof, this inductance value also changes according to changes in temperature.

Figure 12:
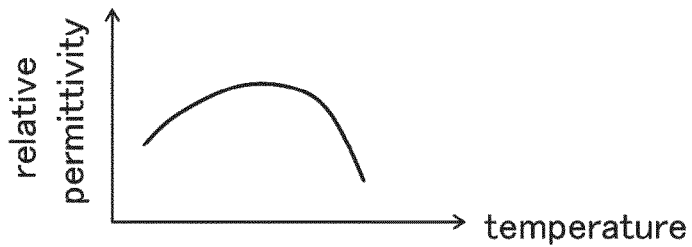
FIG. 12 is a characteristic graph of a dielectric in embodiment 1.

FIG. 12 is a characteristic graph showing a temperature dependence of the relative permittivity of a general dielectric that is used for the grounded capacitor and that is exemplified by barium titanate ($BaTiO_3$). The permittivity of this dielectric has a peak value at a certain temperature, and the permittivity becomes lower as the temperature of the dielectric becomes lower or higher than this temperature. Since the capacitance value of the grounded capacitor is proportionate to the relative permittivity thereof, this capacitance value also changes according to changes in temperature.

Figure 13A:
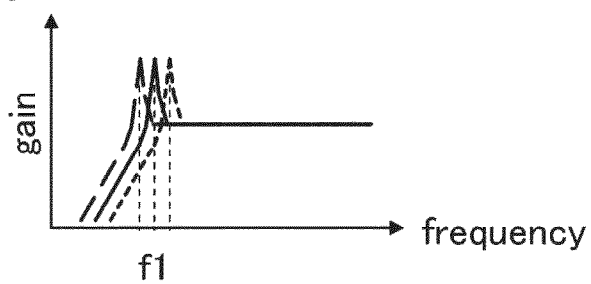
FIG. 13A, FIG. 13B and FIG. 13C are schematic diagrams showing control responses of the main circuit portion in embodiment 1.
Figure 13B:
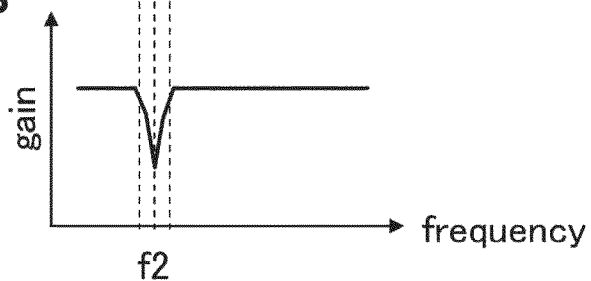
Figure 13C:
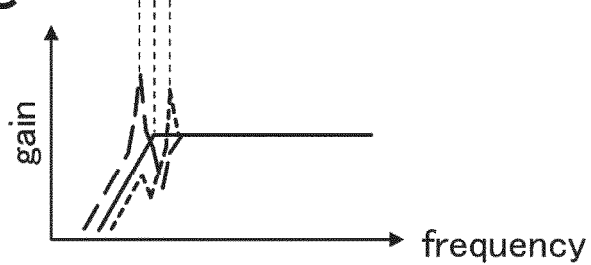

FIG. 13A, FIG. 13B and FIG. 13C are schematic diagrams showing control responses of the main circuit portion 20 with the temperature being changed. In FIG. 13A, FIG.

13B and FIG. 13C, the horizontal axis indicates frequency, and the vertical axis indicates gain. In FIG. 13A, FIG. 13B and FIG. 13C, the solid line indicates a characteristic curve at a normal temperature, the dash line indicates a characteristic curve at the temperature higher than the normal temperature, and the long-dash line indicates a characteristic curve at the temperature lower than the normal temperature. Here, the magnetic permeability of the core material used for the common mode choke coil is assumed to increase in association with rise in the temperature, and the permittivity of the dielectric used for the grounded capacitor is assumed to decrease in association with rise in the temperature. The rate of increase in the magnetic permeability in association with rise in the temperature is assumed to be lower than the rate of decrease in the permittivity in association with rise in the temperature. Therefore, the product of the inductance value and the capacitance value of the main circuit portion 20 decreases in association with rise in the temperature. As a result, the resonance frequency increases in association with rise in the temperature.

FIG. 13A is a schematic diagram showing an open-loop response obtained in the case where the filter part 16 is not present. As described above, the resonance frequency increases in association with rise in the temperature. Therefore, relative to a resonance peak at the normal temperature indicated by the solid line, a resonance peak at the high temperature indicated by the dash line is shifted to the high frequency side, and a resonance peak at the low temperature indicated by the long-dash line is shifted to the low frequency side.

FIG. 13B is a schematic diagram showing the filter passage characteristic of the filter part 16. Here, the rejection frequency of the filter part 16 is assumed not to change according to the temperature. Therefore, the rejection frequency f2 is a frequency that matches the resonance frequency f1 at the normal temperature.

FIG. 13C is a schematic diagram showing an open-loop response obtained in the case where the filter part 16 is present. As indicated by the solid line in FIG. 13C, at the normal temperature, the frequency of the corresponding resonance peak shown in FIG. 13A and the rejection frequency shown in FIG. 13B match each other, and thus the resonance peak is attenuated. However, at a temperature higher or lower than the normal temperature, the frequency of the corresponding resonance peak shown in FIG. 13A and the rejection frequency shown in FIG. 13B do not match each other, and thus an unnecessary resonance peak is generated in the open-loop response as indicated by the dash line or the long-dash line in FIG. 13C. As a result, the control response of the main circuit portion 20 is destabilized, and the noise suppression effect of the noise filter 10 is reduced.

The noise filter in the present embodiment is configured such that the noise suppression effect is not reduced even when the resonance frequency changes according to changes in temperature. Specifically, the temperature dependence of the product of the inductance value and the capacitance value of the filter part 16 is set to be equal to the temperature dependence of the product of the inductance value and the capacitance value of the main circuit portion 20. By performing setting in this manner, the rejection frequency of the filter part 16 can be shifted according to changes in temperature correspondingly to the shift of the resonance frequency of the main circuit portion 20.

Here, the clause "the temperature dependence of the product of the inductance value and the capacitance value of the filter part 16, and the temperature dependence of the product of the inductance value and the capacitance value of the main circuit portion 20, are equal to each other" means that the amount of change, in the value of L1×C1, that occurs according to changes in temperature and the amount of change, in the value of L2×C2, that occurs according to changes in temperature are equal to each other. However, as described later, the said clause is not limited to situations in which the two amounts of changes are exactly equal to each other, and situations in which a certain extent of difference is present between the two amounts of changes are also encompassed in the meaning that the amounts of changes are equal to each other.

Next, a configuration of the noise filter in the present embodiment will be described.

Figure 14:
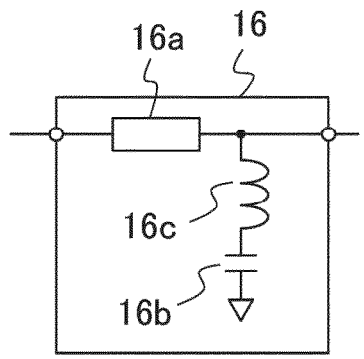
FIG. 14 is a configuration diagram of a filter part according to embodiment 1.

FIG. 14 is a configuration diagram showing an example of the filter part 16 in the present embodiment. This filter part 16 is composed of a resistor 16a, a capacitor 16b, and an inductor 16c. The filter part 16 is composed of: the resistor 16a; and the inductor 16c and the capacitor 16b located on the output side relative to this resistor 16a and connected in series between the electrical path and the ground potential. This filter part 16 is an RLC notch filter and attenuates a gain by means of the rejection frequency.

In the present embodiment, the temperature dependence of the product of the inductance value and the capacitance value of the main circuit portion 20, and the temperature dependence of the product of an inductance value of the inductor 16c and a capacitance value of the capacitor 16b of the filter part 16, are set to be equal to each other. Specifically, the core material of each of the common mode choke coils forming the noise detection unit 12 and the injection unit 14, and a core material of the inductor 16c of the filter part 16, are the same material. Further, the dielectric of the grounded capacitor 15 and a dielectric of the capacitor 16b of the filter part 16 are the same material. It is noted that the core material in the main circuit portion 20 and the core material in the filter part 16 do not necessarily have to be the same material and may be different materials having magnetic permeabilities, the temperature dependences of the magnetic permeabilities being equal to each other. Likewise, the dielectric in the main circuit portion 20 and the dielectric in the filter part 16 do not necessarily have to be the same material and may be different materials having permittivities, the temperature dependences of the permittivities being equal to each other.

Next, an operation of the noise filter in the present embodiment will be described.

Figure 15A:
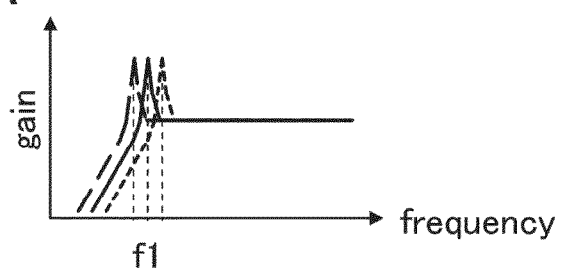
FIG. 15A, FIG. 15B and FIG. 15C are schematic diagrams showing control responses of the main circuit portion in embodiment 1.
Figure 15B:
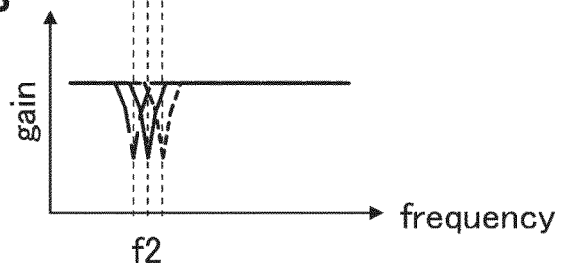
Figure 15C:
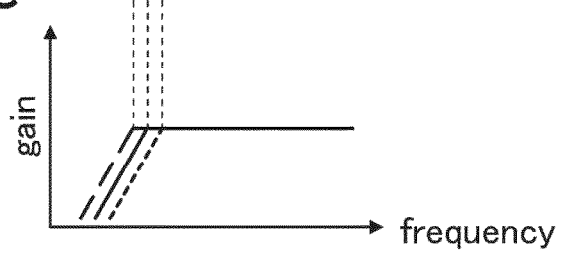

FIG. 15A, FIG. 15B and FIG. 15C are schematic diagrams showing control responses of the main circuit portion 20 with the temperature being changed in the noise filter 10 in the present embodiment. In FIG. 15A, FIG. 15B and FIG. 15C, the horizontal axis indicates frequency, and the vertical axis indicates gain. In FIG. 15A, FIG. 15B and FIG. 15C, the solid line indicates the characteristic curve at the normal temperature, the dash line indicates the characteristic curve at the temperature higher than the normal temperature, and the long-dash line indicates the characteristic curve at the temperature lower than the normal temperature. Here, the resonance frequency of the main circuit portion 20 is assumed to increase in association with rise in the temperature in the same manner as in FIG. 13A, FIG. 13B and FIG. 13C.

FIG. 15A is a schematic diagram showing an open-loop response obtained in the case where the filter part 16 is not present. As described above, the resonance frequency increases in association with rise in the temperature. Therefore, relative to the resonance peak at the normal temperature indicated by the solid line, the resonance peak at the high temperature indicated by the dash line is shifted to the high frequency side, and the resonance peak at the low temperature indicated by the long-dash line is shifted to the low frequency side.

FIG. 15B is a schematic diagram showing filter passage characteristics of the filter part 16. Here, if the inductance value of the filter part 16 is defined as L2 and the capacitance value of the filter part 16 is defined as C2, the rejection frequency f2 of the filter part 16 is expressed as $f2=1/\{2\pi\sqrt{4}(L2\times C2)\}$. The temperature dependence of the product of the inductance value and the capacitance value of the filter part 16 is set to be equal to the temperature dependence of the product of the inductance value and the capacitance value of the main circuit portion 20. That is, the amount of change, in the value of $L1\times C1$, that occurs according to changes in temperature and the amount of change, in the value of $L2\times C2$, that occurs according to changes in temperature are set to be equal to each other. Therefore, the rejection frequency of the filter part 16 is shifted according to the temperature in the same manner as the resonance frequency of the main circuit portion 20. That is, relative to a rejection frequency at the normal temperature indicated by the solid line, a rejection frequency at the high temperature indicated by the dash line is shifted to the high frequency side, and a rejection frequency at the low temperature indicated by the long-dash line is shifted to the low frequency side. Consequently, the amount of shift, of the resonance frequency, that occurs according to changes in temperature and the amount of shift, of the rejection frequency, that occurs according to changes in temperature become equal to each other.

FIG. 15C is a schematic diagram showing an open-loop response obtained in the case where the filter part 16 is present. As indicated by the solid line in FIG. 15C, at the normal temperature, the frequency of the corresponding resonance peak shown in FIG. 15A and the corresponding rejection frequency shown in FIG. 15B match each other, and thus the resonance peak is attenuated. Further, at a temperature higher or lower than the normal temperature, the rejection frequency shown in FIG. 15B is also shifted in the same manner as the manner in which the resonance peak shown in FIG. 15A is shifted. Thus, an unnecessary resonance peak is attenuated in the open-loop response as indicated by the dash line or the long-dash line in FIG. 15C. As a result, the noise filter 10 can exhibit the stable noise suppression effect.

In the noise filter having been thus configured, the temperature dependence of the product of the inductance value and the capacitance value of the main circuit portion, and the temperature dependence of the product of the inductance value and the capacitance value of the filter part, are set to be equal to each other. Consequently, the noise suppression effect is not reduced even when the resonance frequency changes according to changes in temperature. In addition, this noise filter eliminates the need for a temperature detector which detects a temperature of the noise detection unit or the like and a controller which causes the frequency characteristic of the filter part to match the resonance frequency according to the temperature. Thus, this noise filter requires low cost.

It is noted that the clause "the temperature dependences are equal to each other" is not limited to the situation in which the temperature dependences exactly match each other in the present embodiment. Situations in which a difference is present between the temperature dependences so as to still allow exhibition of the above stable noise suppression effect are also encompassed in the same scope as that of the clause. For example, even if the core material of each of the common mode choke coils forming the noise detection unit 12 and the injection unit 14, and the core material of the inductor 16c of the filter part 16, are the same material, there is a difference between the temperature dependences that is caused by a difference in characteristic between the materials, a difference in dimension between the components, or the like, and this difference between the temperature dependences and other differences are encompassed in the same scope. Meanwhile, a material that is each of the core material and the dielectric included in the main circuit portion 20, and a material that is the corresponding one of the core material and the dielectric included in the filter part 16, may be different from each other as long as the temperature dependence of the product of the inductance value and the capacitance value is equal between the core materials or between the dielectrics. As each core material, for example, Mn—Zn ferrite, Ni—Zn ferrite, or the like can be used. As each dielectric, barium titanate ($BaTiO_3$), strontium titanate ($SrTiO_3$), lead oxide (PbO), or the like can be used.

If magnetic materials have Curie temperatures equal to each other and initial magnetic permeabilities equal to each other, the temperature dependences of the magnetic permeabilities of the magnetic materials can also be determined to be equal to each other. Therefore, in the present embodiment, the Curie temperature of the core material of the common mode choke coil and the Curie temperature of the core material of the inductor included in the filter part may be equal to each other, and the initial magnetic permeability of the core material of the common mode choke coil and the initial magnetic permeability of the core material of the inductor included in the filter part may be equal to each other.

In addition, although an example of configuring the amplification part as a circuit in which an operational amplifier is used has been described in the present embodiment, the amplification part may be configured as another inverting amplification circuit or another non-inverting amplification circuit. In the noise filter in the present embodiment, another common mode choke coil may further be connected in addition to the noise detection unit and the injection unit. Alternatively, at least one of the noise detection unit and the injection unit may be formed as a capacitor instead of the common mode choke coil. The resonance frequency of the main circuit portion is determined according to the inductance components and the capacitive component of all of the elements thereof. Further, although the power conversion system in the present embodiment is a three-phase three-wire type power conversion system, the power conversion system may be a three-phase four-wire type power conversion system.

Embodiment 2

In the noise filter in embodiment 1, the filter part is a notch filter. In a noise filter in embodiment 2, the filter part is formed as a high-pass filter. The configuration of the noise filter in the present embodiment is the same as the configuration of the noise filter shown in FIG. 4 in embodiment 1, except for the filter part.

Figure 16:
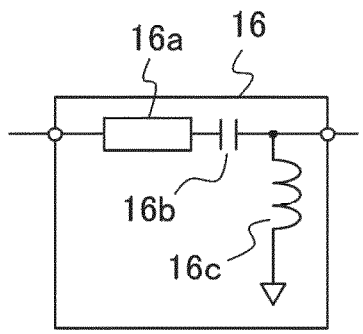
FIG. 16 is a configuration diagram of a filter part according to embodiment 2.

FIG. 16 is a configuration diagram of a filter part 16 according to the present embodiment. This filter part 16 is composed of the resistor 16a, the capacitor 16b, and the inductor 16c. The filter part 16 is composed of: the resistor 16a and the capacitor 16b connected in series; and the inductor 16c located on the output side relative to the capacitor 16b and connected between the electrical path and the ground potential. This filter part 16 is an LC high-pass filter and attenuates a gain of a frequency that is lower than a specific frequency called a cut-off frequency. The filter part 16 generates a cancellation signal by performing LC high-pass filtering on the common mode noise detection signal inputted from the noise detection unit 12 and outputs this cancellation signal to the amplification part 17.

In the present embodiment, the temperature dependence of the product of the inductance value and the capacitance value of the main circuit portion 20, and the temperature dependence of the product of the inductance value of the inductor 16c and the capacitance value of the capacitor 16b of the filter part 16, are set to be equal to each other. Specifically, the core material of each of the common mode choke coils forming the noise detection unit 12 and the injection unit 14, and a core material of the inductor 16c of the filter part 16, are the same material. Further, the dielectric of the grounded capacitor 15 and a dielectric of the capacitor 16b of the filter part 16 are the same material. It is noted that the core material in the main circuit portion 20 and the core material in the filter part 16 do not necessarily have to be the same material and may be different materials having magnetic permeabilities, the temperature dependences of the magnetic permeabilities being equal to each other. Likewise, the dielectric in the main circuit portion 20 and the dielectric in the filter part 16 do not necessarily have to be the same material and may be different materials having permittivities, the temperature dependences of the permittivities being equal to each other.

Next, an operation of the noise filter in the present embodiment will be described.

Figure 17A:
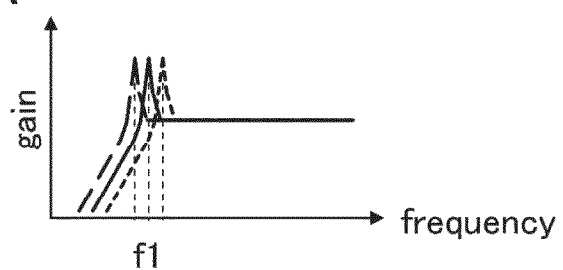
FIG. 17A, FIG. 17B and FIG. 17C are schematic diagrams showing control responses of the main circuit portion in embodiment 2.
Figure 17B:
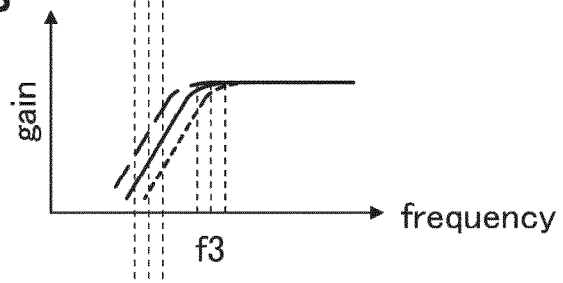
Figure 17C:
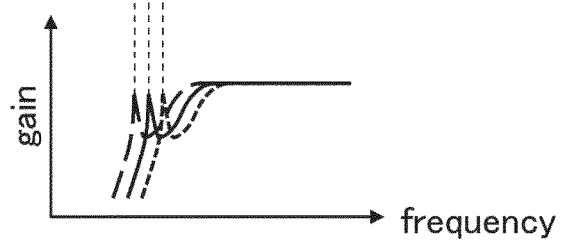

FIG. 17A, FIG. 17B and FIG. 17C are schematic diagrams showing control responses of the main circuit portion 20 with the temperature being changed in the noise filter in the present embodiment. In FIG. 17A, FIG. 17B and FIG. 17C, the horizontal axis indicates frequency, and the vertical axis indicates gain. In FIG. 17A, FIG. 17B and FIG. 17C, the solid line indicates the characteristic curve at the normal temperature, the dash line indicates the characteristic curve at the temperature higher than the normal temperature, and the long-dash line indicates the characteristic curve at the temperature lower than the normal temperature. Here, the resonance frequency of the main circuit portion 20 is assumed to increase in association with rise in the temperature in the same manner as in FIG. 13A, FIG. 13B and FIG. 13C in embodiment 1.

FIG. 17A is a schematic diagram showing an open-loop response obtained in the case where the filter part 16 is not present. As described above, the resonance frequency increases in association with rise in the temperature. Therefore, relative to the resonance peak at the normal temperature indicated by the solid line, the resonance peak at the high temperature indicated by the dash line is shifted to the high frequency side, and the resonance peak at the low temperature indicated by the long-dash line is shifted to the low frequency side.

FIG. 17B is a schematic diagram showing filter passage characteristics of the filter part 16. Here, if the inductance value of the filter part 16 is defined as L3 and the capacitance value of the filter part 16 is defined as C3, a cut-off frequency f3 of the filter part 16 is expressed as $f3=1/\{2\pi\sqrt{(L3 \times C3)}\}$. The temperature dependence of the product of the inductance value and the capacitance value of the filter part 16 is set to be equal to the temperature dependence of the product of the inductance value and the capacitance value of the main circuit portion 20. That is, the amount of change, in the value of L1×C1, that occurs according to changes in temperature and the amount of change, in the value of L3×C3, that occurs according to changes in temperature are set to be equal to each other. Therefore, the cut-off frequency of the filter part 16 is shifted according to the temperature in the same manner as the resonance frequency of the main circuit portion 20. That is, relative to the cut-off frequency at the normal temperature indicated by the solid line, the cut-off frequency at the high temperature indicated by the dash line is shifted to the high frequency side, and the cut-off frequency at the low temperature indicated by the long-dash line is shifted to the low frequency side. Consequently, the amount of shift, of the resonance frequency, that occurs according to changes in temperature and the amount of shift, of the cut-off frequency, that occurs according to changes in temperature become equal to each other.

FIG. 17C is a schematic diagram showing an open-loop response obtained in the case where the filter part 16 is present. As indicated by the solid line in FIG. 17C, at the normal temperature, the frequency of the corresponding resonance peak shown in FIG. 17A is lower than the corresponding cut-off frequency shown in FIG. 17B, and thus the resonance peak is attenuated. Further, at a temperature higher or lower than the normal temperature, the cut-off frequency shown in FIG. 17B is also shifted in the same manner as the manner in which the resonance peak shown in FIG. 17A is shifted. Thus, an unnecessary resonance peak is attenuated in the open-loop response as indicated by the dash line or the long-dash line in FIG. 17C. As a result, the noise filter 10 can exhibit the stable noise suppression effect.

In the noise filter having been thus configured, the temperature dependence of the product of the inductance value and the capacitance value of the main circuit portion, and the temperature dependence of the product of the inductance value and the capacitance value of the filter part, are set to be equal to each other. Consequently, the noise suppression effect is not reduced even when the resonance frequency changes according to changes in temperature. In addition, this noise filter eliminates the need for a temperature detector which detects a temperature of the noise detection unit or the like and a controller which causes the frequency characteristic of the filter part to match the resonance frequency according to the temperature. Thus, this noise filter requires low cost.

It is noted that the filter part is formed as a notch filter in the noise filter in embodiment 1. Meanwhile, the filter part is formed as a high-pass filter in the noise filter in embodiment 2. The filter part may be formed as another filter such as a low-pass filter or a band-pass filter instead of the notch filter and the high-pass filter.

Embodiment 3

In each of the noise filters in embodiment 1 and embodiment 2, both the magnetic permeability of the core material of each of the common mode choke coils forming the noise detection unit and the injection unit and the permittivity of the dielectric of the grounded capacitor, change according to changes in temperature. Therefore, the inductance value and the capacitance value of the main circuit portion also change according to changes in temperature. A noise filter in embodiment 3 is a noise filter in which the capacitance value of the main circuit portion does not change according to changes in temperature.

The temperature of an environment in which a general electrical device is used is within a range from −40° C. to 85° C. The permittivities of ferroelectrics such as barium titanate ($BaTiO_3$), strontium titanate ($SrTiO_3$), and lead oxide (PbO) which have been described as dielectrics usable for the grounded capacitor, change by, for example, up to several tens of percent in the temperature range from −40° C. to 85° C. Meanwhile, changes in the permittivities of paraelectrics that are used for temperature-compensating capacitors and that are exemplified by titanium oxide ($TiO_2$), calcium zirconate ($CaZrO_3$), and the like are negligibly smaller than the changes in the permittivities of the above ferroelectrics. In the noise filter in the present embodiment, a paraelectric is used as the dielectric of the grounded capacitor. It is noted that, in the noise filter in the present embodiment, the core material of each of the common mode choke coils forming the noise detection unit and the injection unit is Mn—Zn ferrite which is a general core material in the same manner as in embodiment 1. Therefore, the magnetic permeability of the core material of each of the common mode choke coils forming the noise detection unit and the injection unit changes according to changes in temperature as shown in FIG. 11 in embodiment 1.

Figure 18:
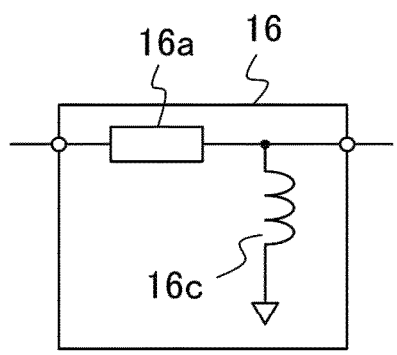
FIG. 18 is a configuration diagram of a filter part according to embodiment 3.

FIG. 18 is a configuration diagram of a filter part 16 in the present embodiment. This filter part 16 is composed of the resistor 16a and the inductor 16c. The filter part 16 is composed of: the resistor 16a; and the inductor 16c located on the output side relative to this resistor 16a and connected between the electrical path and the ground potential. This filter part 16 is an RL high-pass filter and attenuates a gain of a frequency that is lower than a specific frequency called a cut-off frequency. The filter part 16 generates a cancellation signal by performing RL high-pass filtering on the common mode noise detection signal inputted from the noise detection unit 12 and outputs this cancellation signal to the amplification part 17.

In the present embodiment, since the grounded capacitor is made of a paraelectric, the capacitance value of the main circuit portion 20 does not change according to changes in temperature. In the main circuit portion 20, only the inductance value changes according to changes in temperature. Meanwhile, the filter part 16 is composed of the resistor 16a and the inductor 16c and does not include any capacitor. The only capacitive component of the filter part 16 is a parasitic capacitance generated between the filter part 16 and the ground potential. A capacitance value of this parasitic capacitance is much smaller than the capacitance value of the grounded capacitor, and can be regarded as being unchanging even upon changes in temperature. Therefore, in the filter part 16 as well, only the inductance value changes according to changes in temperature.

In the present embodiment, the core material of each of the common mode choke coils forming the noise detection unit 12 and the injection unit 14, and the core material of the inductor 16c of the filter part 16, are the same material. With such a configuration, the temperature dependence of the inductance value of the main circuit portion 20 and the temperature dependence of the inductance value of the inductor 16c of the filter part 16 can be set to be equal to each other.

In the noise filter having been thus configured, when the resonance frequency generated in the open-loop response is shifted according to changes in temperature, the cut-off frequency of the filter part 16 is also shifted so as to follow this shift. Therefore, an unnecessary resonance peak is attenuated in the open-loop response.

In the noise filter having been thus configured, the temperature dependence of the product of the inductance value and the capacitance value of the main circuit portion, and the temperature dependence of the product of the inductance value and the capacitance value of the filter part, are set to be equal to each other. Consequently, the noise suppression effect is not reduced even when the resonance frequency changes according to changes in temperature. In addition, this noise filter eliminates the need for a temperature detector which detects a temperature of the noise detection unit or the like and a controller which causes the frequency characteristic of the filter part to match the resonance frequency according to the temperature. Thus, this noise filter requires low cost.

It is noted that the core material in the main circuit portion 20 and the core material in the filter part 16 do not necessarily have to be the same material and may be different materials having magnetic permeabilities, the temperature dependences of the magnetic permeabilities being equal to each other.

Embodiment 4

In each of the noise filters in embodiment 1 and embodiment 2, both the magnetic permeability of the core material of each of the common mode choke coils forming the noise detection unit and the injection unit and the permittivity of the dielectric of the grounded capacitor, change according to changes in temperature. Therefore, the inductance value and the capacitance value of the main circuit portion also change according to changes in temperature. A noise filter according to embodiment 4 is a noise filter in which the inductance value of the main circuit portion does not change according to changes in temperature.

The magnetic permeabilities of Mn—Zn ferrite and the like which have been described as core materials usable for each common mode choke coil, change by, for example, up to several tens of percent in the temperature range from −40° C. to 85° C. Meanwhile, changes in the magnetic permeabilities of a nanocrystal material and the like having high Curie temperatures are negligibly smaller than a change in the magnetic permeability of the above Mn—Zn ferrite. Examples of core materials having high Curie temperatures include amorphous materials, nanocrystal materials, and the like. In the noise filter in the present embodiment, an amorphous material or a nanocrystal material is used as the core material used for the common mode choke coil. It is noted that, in the noise filter in the present embodiment, the dielectric of the grounded capacitor is barium titanate ($BaTiO_3$) which is a general dielectric in the same manner as in embodiment 1. Therefore, the permittivity of the grounded capacitor changes according to changes in temperature as shown in FIG. 12 in embodiment 1.

Figure 19:
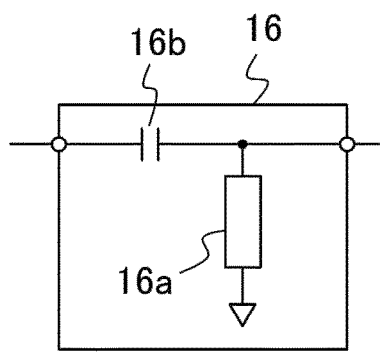
FIG. 19 is a configuration diagram of a filter part according to embodiment 4.

FIG. 19 is a configuration diagram of a filter part 16 in the present embodiment. This filter part 16 is composed of the resistor 16a and the capacitor 16b. The filter part 16 is composed of: the capacitor 16b; and the resistor 16a located on the output side relative to this capacitor 16b and connected between the electrical path and the ground potential. This filter part 16 is an RC high-pass filter and attenuates a gain of a frequency that is lower than a specific frequency called a cut-off frequency. The filter part 16 generates a cancellation signal by performing RC high-pass filtering on the common mode noise detection signal inputted from the noise detection unit 12 and outputs this cancellation signal to the amplification part 17.

In the present embodiment, since the core material of each of the common mode choke coils forming the noise detection unit and the injection unit is an amorphous material or a nanocrystal material, the inductance value of the main circuit portion 20 does not change according to changes in temperature. In the main circuit portion 20, only the capacitance value changes according to changes in temperature. Meanwhile, the filter part 16 is composed of the resistor 16a and the capacitor 16b and does not include any inductor. The only inductance component of the filter part 16 is a parasitic inductor generated on a wire. An inductance value of this parasitic inductor is much smaller than the inductance value of the common mode choke coil, and can be regarded as being unchanging even upon changes in temperature. Therefore, in the filter part 16 as well, only the capacitance value changes according to changes in temperature.

In the present embodiment, the dielectric of the grounded capacitor of the main circuit portion and the dielectric of the capacitor 16b of the filter part 16 are the same material. With such a configuration, the temperature dependence of the capacitance value of the main circuit portion 20 and the temperature dependence of the capacitance value of the capacitor 16b of the filter part 16 can be set to be equal to each other.

In the noise filter having been thus configured, when the resonance frequency generated in the open-loop response is shifted according to changes in temperature, the cut-off frequency of the filter part 16 is also shifted so as to follow this shift. Therefore, an unnecessary resonance peak is attenuated in the open-loop response.

In the noise filter having been thus configured, the temperature dependence of the product of the inductance value and the capacitance value of the main circuit portion, and the temperature dependence of the product of the inductance value and the capacitance value of the filter part, are set to be equal to each other. Consequently, the noise suppression effect is not reduced even when the resonance frequency changes according to changes in temperature. In addition, this noise filter eliminates the need for a temperature detector which detects a temperature of the noise detection unit or the like and a controller which causes the frequency characteristic of the filter part to match the resonance frequency according to the temperature. Thus, this noise filter requires low cost.

It is noted that the dielectric in the main circuit portion 20 and the dielectric in the filter part 16 do not necessarily have to be the same material and may be different materials having permittivities, the temperature dependences of the permittivities being equal to each other.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 AC power supply
2 power supply wire
3 ground wire
10 noise filter
11 electrical path
12 noise detection unit
12a, 14a R-phase winding
12b, 14b S-phase winding
12c, 14c T-phase winding
12d, 14d auxiliary winding
13 cancellation signal output unit
14 injection unit
15 grounded capacitor
16 filter part
16a resistor
16b capacitor
16c inductor
17 amplification part
17a input resistor
17b operational amplifier
17c feedback resistor
20 main circuit portion
80 power conversion device
81 DC power supply
82, 83, 84 upper-lower arm
82a, 82b, 83a, 83b, 84a, 84b semiconductor switch
85 inverter output terminal
86, 91 parasitic capacitance
90 load
100 power conversion system

The invention claimed is:

1. A noise filter comprising:
a noise detector which detects a common mode noise on an electrical path;
a cancellation signal output circuitry which generates a cancellation signal from the detected common mode noise and outputs the cancellation signal;
an injector which injects the cancellation signal into the electrical path; and
a grounded capacitor connected to the electrical path, wherein
the cancellation signal output circuitry includes
a filter part which generates the cancellation signal by filtering the detected common mode noise, and
an amplification part which amplifies the cancellation signal, and
a temperature dependence of a product of an inductance value and a capacitance value of a main circuit portion including the noise detector, the injector, and the grounded capacitor, and a temperature dependence of a product of an inductance value and a capacitance value of the filter part, are equal to each other.

2. The noise filter according to claim 1, wherein
each of the noise detector and the injector is formed as a common mode choke coil.

3. The noise filter according to claim 2, wherein
the filter part includes an inductor and a capacitor,
a core material of the common mode choke coil and a core material of the inductor included in the filter part are materials having magnetic permeabilities, temperature dependences of the magnetic permeabilities being equal to each other, and
a dielectric of the grounded capacitor and a dielectric of the capacitor included in the filter part are materials having permittivities, temperature dependences of the permittivities being equal to each other.

4. The noise filter according to claim 3, wherein
a Curie temperature of the core material of the common mode choke coil and a Curie temperature of the core material of the inductor included in the filter part are equal to each other, and
an initial magnetic permeability of the core material of the common mode choke coil and an initial magnetic permeability of the core material of the inductor included in the filter part are equal to each other.

5. The noise filter according to claim 3, wherein
the core material of the common mode choke coil and the core material of the inductor included in the filter part are a same material, and
the dielectric of the grounded capacitor and the dielectric of the capacitor included in the filter part are a same material.

6. The noise filter according to claim 2, wherein
the filter part is composed of a resistor and an inductor,
the grounded capacitor is made of a paraelectric, and
a core material of the common mode choke coil and a core material of the inductor of the filter part are materials having magnetic permeabilities, temperature dependences of the magnetic permeabilities being equal to each other.

7. The noise filter according to claim 6, wherein
the core material of the common mode choke coil and the core material of the inductor included in the filter part are a same material.

8. The noise filter according to claim 2, wherein
the filter part is composed of a resistor and a capacitor,
a core material of the common mode choke coil is an amorphous material or a nanocrystal material, and
a dielectric of the grounded capacitor and a dielectric of the capacitor of the filter part are materials having permittivities, temperature dependences of the permittivities being equal to each other.

9. The noise filter according to claim 8, wherein
the dielectric of the grounded capacitor and the dielectric of the capacitor of the filter part are a same material.

10. The noise filter according to claim 4, wherein
the core material of the common mode choke coil and the core material of the inductor included in the filter part are a same material, and
the dielectric of the grounded capacitor and the dielectric of the capacitor included in the filter part are a same material.

* * * * *